(12) United States Patent
Ie et al.

(10) Patent No.: US 10,079,186 B2
(45) Date of Patent: Sep. 18, 2018

(54) SEMICONDUCTOR DEVICE AND METHOD OF FABRICATING THE SAME

(71) Applicant: SAMSUNG ELECTRONICS CO., LTD., Suwon-si, Gyeonggi-do (KR)

(72) Inventors: Sangyub Ie, Yongin-si (KR); Minwoo Song, Seongnam-si (KR); Jonghan Lee, Namyangju-si (KR); Hyungsuk Jung, Suwon-si (KR); Hyeri Hong, Incheon (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/273,933

(22) Filed: Sep. 23, 2016

(65) Prior Publication Data

US 2017/0084507 A1    Mar. 23, 2017

(30) Foreign Application Priority Data

Sep. 23, 2015 (KR) .................. 10-2015-0134763
Aug. 17, 2016 (KR) .................. 10-2016-0104477

(51) Int. Cl.
*H01L 23/58* (2006.01)
*H01L 21/66* (2006.01)
(Continued)

(52) U.S. Cl.
CPC ...... *H01L 22/34* (2013.01); *H01L 21/823431* (2013.01); *H01L 21/823437* (2013.01); *H01L 21/823462* (2013.01); *H01L 22/14* (2013.01); *H01L 27/0886* (2013.01); *H01L 29/0847* (2013.01); *H01L 29/42364* (2013.01); *H01L 29/4966* (2013.01); *H01L 29/66545* (2013.01); *H01L 29/7848* (2013.01); *H01L 21/823418* (2013.01)

(58) Field of Classification Search
CPC ..... H01L 22/34; H01L 22/14; H01L 29/7848; H01L 29/66545; H01L 29/42364; H01L 21/823462; H01L 29/0847; H01L 27/0886; H01L 21/823437; H01L 21/823431; H01L 29/4966; H01L 21/823418
See application file for complete search history.

(56) References Cited

U.S. PATENT DOCUMENTS 7,202,691 B2    4/2007 Lagowski et al.
8,275,564 B2    9/2012 Schulze et al.
(Continued)

FOREIGN PATENT DOCUMENTS

EP          2394294 B1     4/2014
KR   10-2011-0106906 A     9/2011
WO   WO 2010/090914 A2     8/2010

*Primary Examiner* — Stephen Bradley
*Assistant Examiner* — Wasiul Haider
(74) *Attorney, Agent, or Firm* — Lee & Morse, P.C.

(57) ABSTRACT

A method of fabricating a semiconductor device includes forming first and second fin patterns in an active region and in a measurement region of a substrate, respectively, the measurement region being different from the active region, forming first and second gate electrodes to cross the first and second fin patterns, respectively, and measuring a contact potential difference (Vcpd) of the second gate electrode to determine a threshold voltage of the first gate electrode based on the measured contact potential difference (Vcpd).

19 Claims, 14 Drawing Sheets

(51) Int. Cl.
*H01L 27/088* (2006.01)
*H01L 29/49* (2006.01)
*H01L 21/8234* (2006.01)
*H01L 29/423* (2006.01)
*H01L 29/66* (2006.01)
*H01L 29/78* (2006.01)
*H01L 29/08* (2006.01)

(56) References Cited

U.S. PATENT DOCUMENTS

| | | | |
|---|---|---|---|
| 8,735,302 B2 | 5/2014 | Joshi et al. | |
| 2015/0243667 A1* | 8/2015 | Liaw | H01L 27/1104 257/390 |
| 2016/0035639 A1* | 2/2016 | Wu | H01L 23/3114 257/690 |
| 2016/0181428 A1* | 6/2016 | Chen | H01L 29/7856 257/401 |
| 2016/0358940 A1* | 12/2016 | Yan | H01L 27/1211 |
| 2017/0271469 A1* | 9/2017 | Huang | H01L 29/4966 |

* cited by examiner

SEMICONDUCTOR DEVICE AND METHOD OF FABRICATING THE SAME

CROSS-REFERENCE TO RELATED APPLICATIONS

Korean Patent Application Nos. 10-2015-0134763, filed on Sep. 23, 2015, and 10-2016-0104477, filed on Aug. 17, 2016, in the Korean Intellectual Property Office, and entitled: "Semiconductor Device and Method of Fabricating the Same," are incorporated by reference herein in their entirety.

BACKGROUND

1. Field

The present disclosure relates to a semiconductor device, and in particular, to methods of fabricating a semiconductor device and of measuring electric characteristics of the semiconductor device during its fabrication, and a semiconductor device fabricated by the method.

2. Description of the Related Art

Research is being conducted to evaluate electric and operational characteristics of a semiconductor device. For example, a threshold voltage (Vth) or an effective work function of a gate electrode is an important parameter affecting performance and yield of the semiconductor device. In order to provide an effective feedback to a quality control of a semiconductor device in a mass-production environment, it is necessary to develop a novel technology capable of quickly and accurately measuring and evaluating a threshold voltage (Vth) or an effective work function of a gate electrode, in a fabrication line environment.

SUMMARY

Some embodiments provide a method of measuring a threshold voltage of a gate electrode or a gate stack electrode in a semiconductor fabrication process, a method of fabricating a semiconductor device using the same, and a semiconductor device fabricated thereby.

Some embodiments also provide a method capable of improving measurement accuracy of a threshold voltage of a gate electrode or a gate stack electrode, a method of fabricating a semiconductor device using the same, and a semiconductor device fabricated thereby.

According to some embodiments, a method of fabricating a semiconductor device may include forming first and second fin patterns in an active region and a measurement region, respectively, of a substrate, the measurement region being different from the active region, forming first and second gate electrodes configured to cross the first and second fin patterns, respectively, and measuring a contact potential difference (Vcpd) of the second gate electrodes to determine a threshold voltage of the first gate electrodes based on the measured contact potential difference (Vcpd).

According to some embodiments, a semiconductor device may include a substrate having active and measurement regions, first and second fin patterns disposed in the active and measurement regions, respectively, an insulating layer having first and second trenches, and first and second gate electrodes disposed in the first and second trenches. The first and second fin patterns may extend in a first direction, and first and second trenches may be formed to partially expose the first and second fin patterns, respectively, in a second direction different from the first direction. The first and second gate electrodes may extend in the second direction.

Each of the second gate electrodes may include a work-function layer and a low-resistance layer on the work-function layer. The work-function layer may have an effective area ratio of 85%-183% with respect to a planar area of the measurement region.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Figure 1:
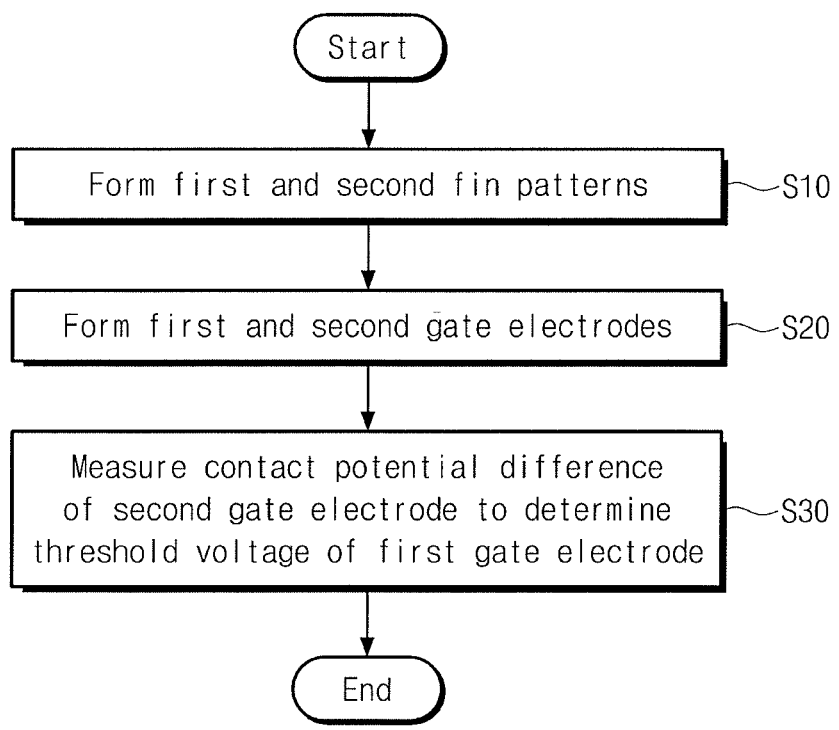
FIG. 1 illustrates a flow chart of a method of fabricating a semiconductor device according to some embodiments.

FIG. 1 illustrates a flow chart of a method of fabricating a semiconductor device, according to some embodiments.

Referring to FIG. 1, a method of fabricating a semiconductor device according to some embodiments may include forming first and second fin patterns (operation S10), forming first and second gate electrodes (operation S20), and measuring a contact potential difference (Vcpd) of the second gate electrode to determine a threshold voltage (Vth) of the first gate electrode (operation S30).

Figure 2:
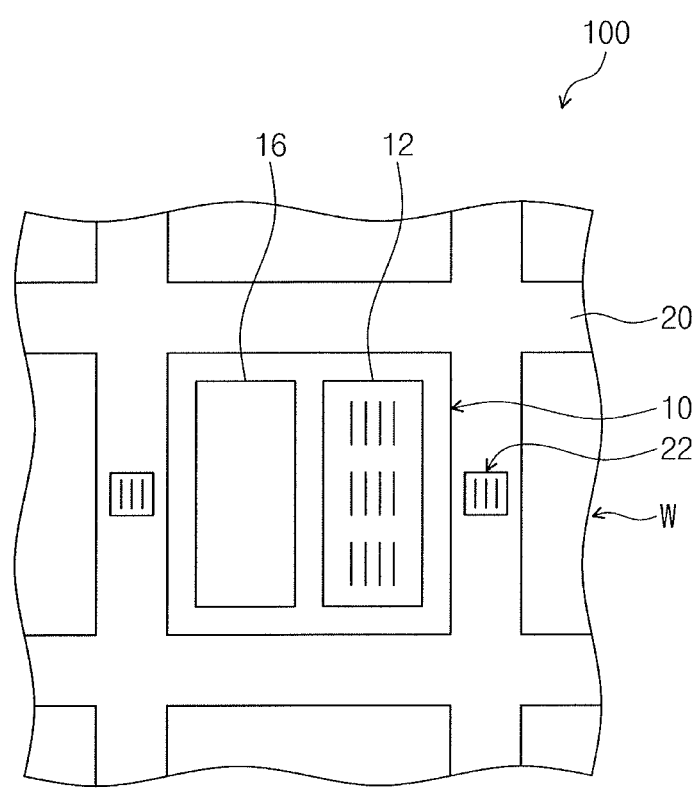
FIG. 2 illustrates a plan view of a substrate, on which a semiconductor device fabricated by the method of FIG. 1 is integrated.

FIG. 2 illustrates a substrate W, on which a semiconductor device fabricated by the method of FIG. 1 is integrated.

Referring to FIG. 2, the substrate W may include device regions 10 and a scribe line region 20. The substrate W may be or may include, e.g., a silicon wafer or a silicon-on-insulator (SOI) wafer.

The device regions 10 may be active regions which are provided in a semiconductor device 100. Each of the device regions 10 may have, e.g., a rectangle-shaped structure. In some embodiments, each of the device regions 10 may include a high-voltage device region 12 and a low-voltage device region 16.

The high-voltage device region 12 may be a region, on which a high-voltage device is integrated. For example, a high-voltage device (e.g., a power voltage unit, a signal amplifying unit, or an application processor (AP) unit) may be formed on the high-voltage device region 12.

The low-voltage device region 16 may be a region, on which a low-voltage device is integrated. The low-voltage device may have an operation voltage that is lower than that of the high-voltage device. For example, the low-voltage device region 16 may include a data storing unit.

The scribe line region 20 may define the device regions 10. The device regions 10 may be separated from each other by the scribe line region 20. In some embodiments, the scribe line region 20 may include a test region 22. The test region 22 may be a non-active region which is provided in the semiconductor device 100. The test region 22 may be a region on which test patterns are formed. For example, the test region 22 may be a region, on which an electric or optical measurement process is performed. In certain embodiments, the test region 22 may be provided in the device regions 10.

Figure 3:
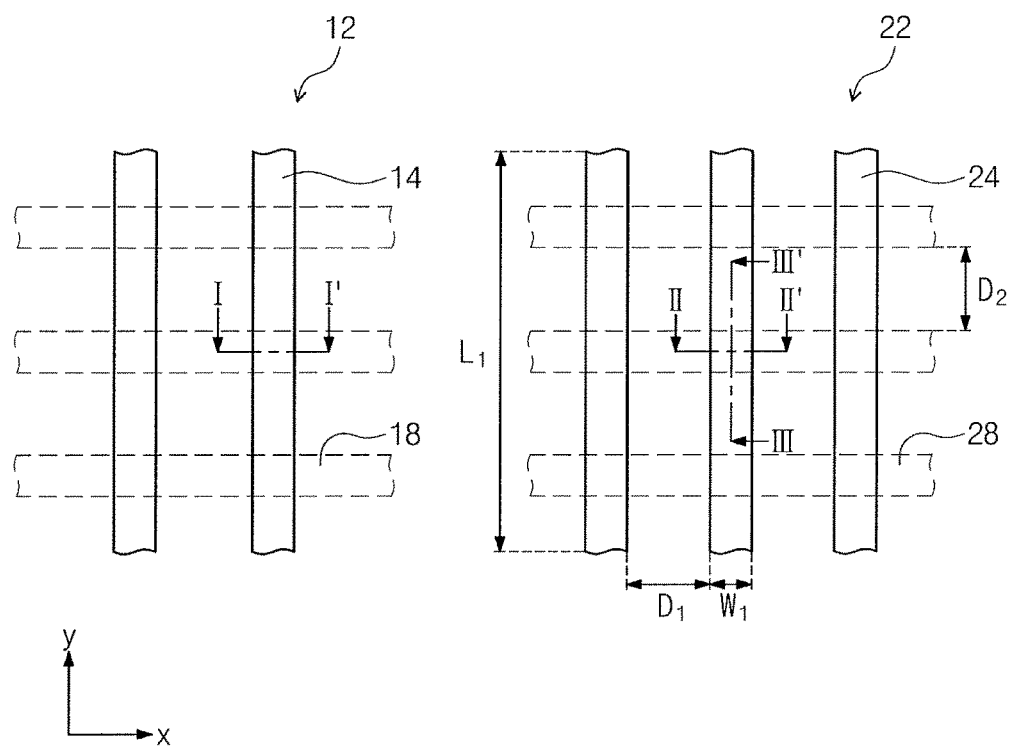
FIG. 3 illustrates plan views of a high-voltage device region and a test region of FIG. 2.
Figure 4:
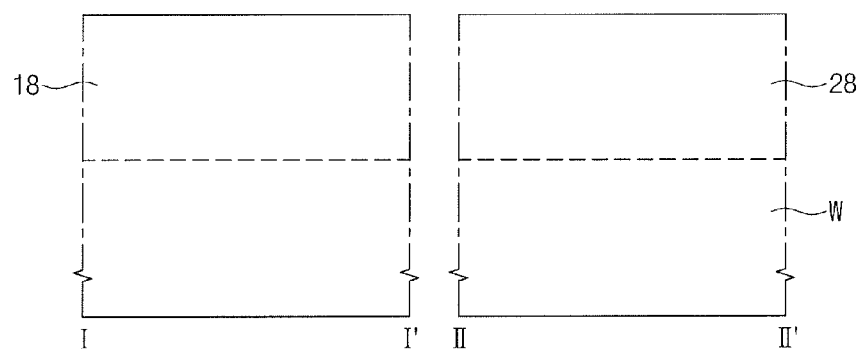
FIG. 4 illustrates sectional views taken along lines I-I' and II-II' of FIG. 3.
Figure 5:
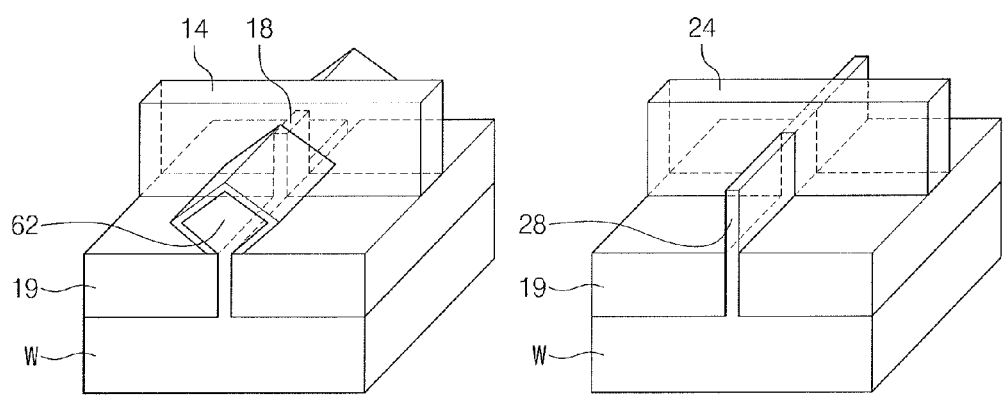
FIG. 5 illustrates perspective views of the first and second fin patterns and the first and second gate electrodes of FIG. 3.

FIG. 3 illustrates plan views of the high-voltage device region 12 and the test region 22 of FIG. 2. FIG. 4 illustrates sectional views taken along lines I-I' and II-II' of FIG. 3. FIG. 5 illustrates perspective views illustrating first and second fin patterns 18 and 28 and first and second gate electrodes 14 and 24 of FIG. 3.

Referring to FIGS. 2 to 5, the semiconductor device 100 may include the first and second gate electrodes 14 and 24 and the first and second fin patterns 18 and 28. The first and second fin patterns 18 and 28 may be disposed to cross the first and second gate electrodes 14 and 24, respectively. The first and second fin patterns 18 and 28 and the first and second gate electrodes 14 and 24 may be formed through the following method.

Firstly, the first and second fin patterns 18 and 28 may be formed on the high-voltage device region 12 and on the test region 22, respectively (operation S10 in FIG. 1). In some embodiments, each of the first and second fin patterns 18 and 28 may be formed to have a shape protruding from the substrate W. Each of the first and second fin patterns 18 and 28 may extend in an x-axis direction. Alternatively, the first and second fin patterns 18 and 28 may extend in different directions. In some embodiments, the second fin patterns 28 may be formed in a distance $D_2$ of 200 nm or less, e.g., adjacent second fin patterns 28 may be spaced apart from each other by the distance $D_2$. Each of the first and second fin patterns 18 and 28 may include a single crystalline silicon pattern grown from the substrate W. The first and second fin patterns 18 and 28 may contain impurities and thus have a conductive property. A device isolation layer 19 may be formed outside the first and second fin patterns 18 and 28. The device isolation layer 19 may be formed, e.g., by a shallow-trench isolation (STI) technology. The device isolation layer 19 may be formed of or include, e.g., silicon oxide.

Next, the first and second gate electrodes 14 and 24 may be formed on the first and second fin patterns 18 and 28, respectively (operation S20 in FIG. 1). Also, the first and second gate electrodes 14 and 24 may be formed on the device isolation layer 19 of the high-voltage device region 12 and the test region 22. In some embodiments, at least three second gate electrodes 24 may be formed on the test region 22. The first and second gate electrodes 14 and 24 may extend in a direction perpendicular to the respective first and second fin patterns 18 and 28, e.g., along a y-axis direction. Each of the first and second gate electrodes 14 and 24 may be a metal gate electrode.

Referring to FIG. 5, stressors 62 may be provided at both, e.g., opposite, sides of the first gate electrode 14. The stressors 62 may be connected to the first fin pattern 18. For example, the stressors 62 may serve as source/drain electrodes. The second fin pattern 28 may extend on the test region 22 in the x-axis direction, without the stressors 62.

Figure 6:
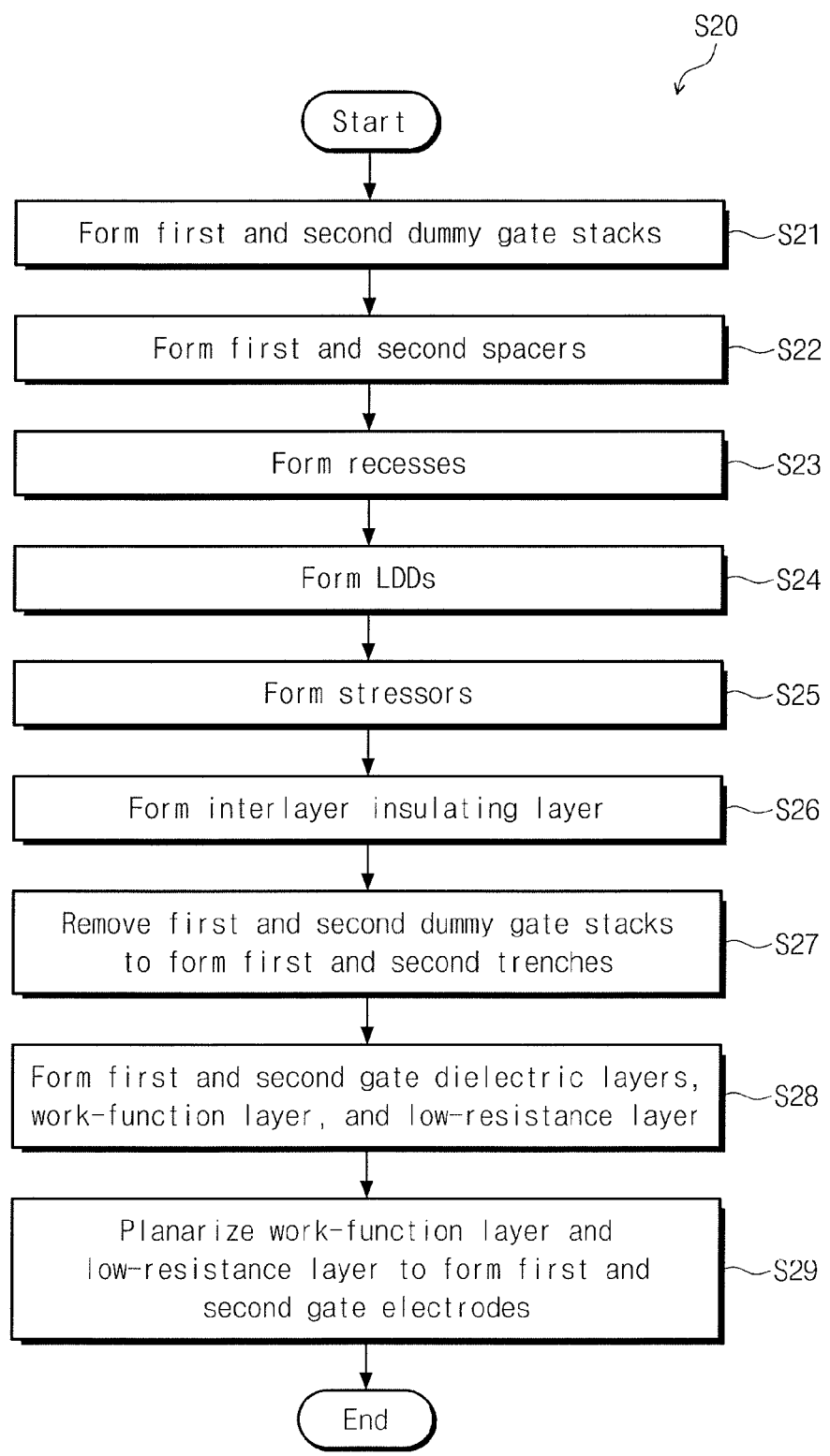
FIG. 6 illustrates a detailed flow chart of operation S20 for forming the first and second gate electrodes in FIG. 1 and FIG. 5.

FIG. 6 illustrates a detailed flow chart of operation S20 in FIG. 1, i.e., of forming the first and second gate electrodes 12 and 24.

Referring to FIG. 6, forming the first and second gate electrodes 14 and 24 may include forming first and second dummy gate stacks (operation S21), forming first and second spacers (operation S22), partially removing the first fin patterns 18 to define recesses (operation S23), forming lightly doped drains (LDDs) (operation S24), forming stressors (operation S25), forming an interlayer insulating layer (operation S26), removing first and second dummy gate stacks (operation S27), forming a gate dielectric layer, a work-function layer, and a low-resistance layer (operation S28), and planarizing the gate dielectric layer, the work-function layer, and the low-resistance layer (operation S29).

FIGS. 7 to 18 illustrate process sectional views of stages in operation S20 in FIG. 6.

Figure 7:
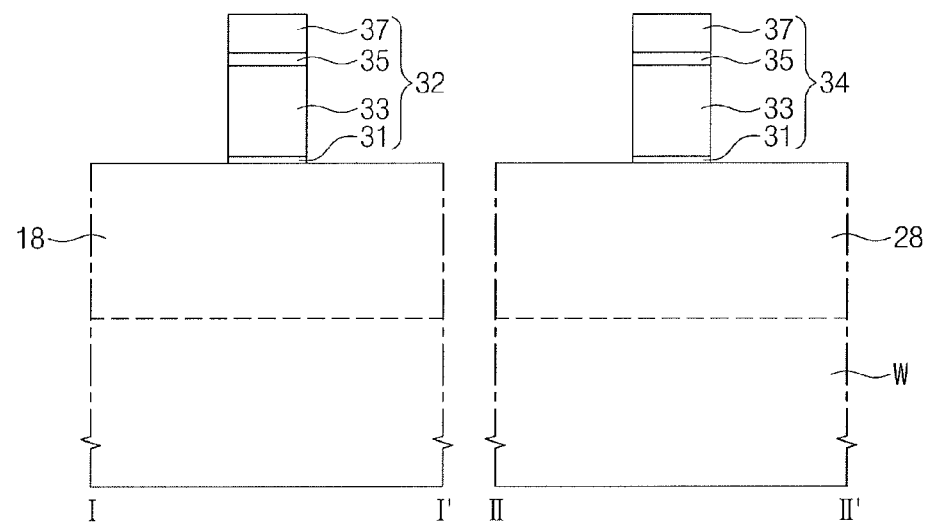
FIGS. 7 to 18 illustrate process sectional views of stages in forming the first and second gate electrodes of FIG. 6.

Referring to FIG. 7, first and second dummy gate stacks 32 and 34 may be formed on the first and second fin patterns 18 and 28, respectively (operation S21). Each of the first and second dummy gate stacks 32 and 34 may include a dummy gate dielectric pattern 31, a dummy gate electrode pattern 33, a buffer pattern 35, and a mask pattern 37. The dummy gate dielectric pattern 31, the dummy gate electrode pattern 33, the buffer pattern 35, and the mask pattern 37 may be formed by a thin-film deposition process, a photolithography process, and etching process.

Figure 8:
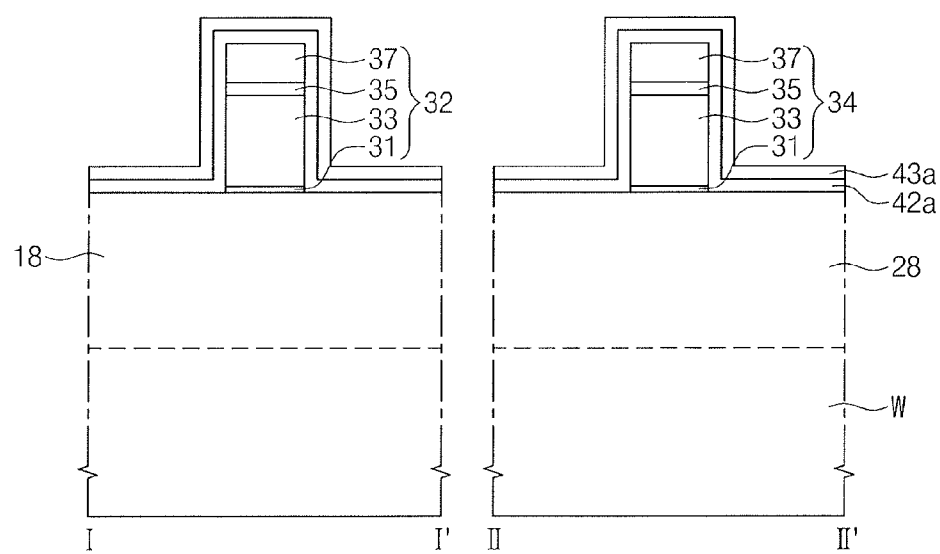
Figure 9:
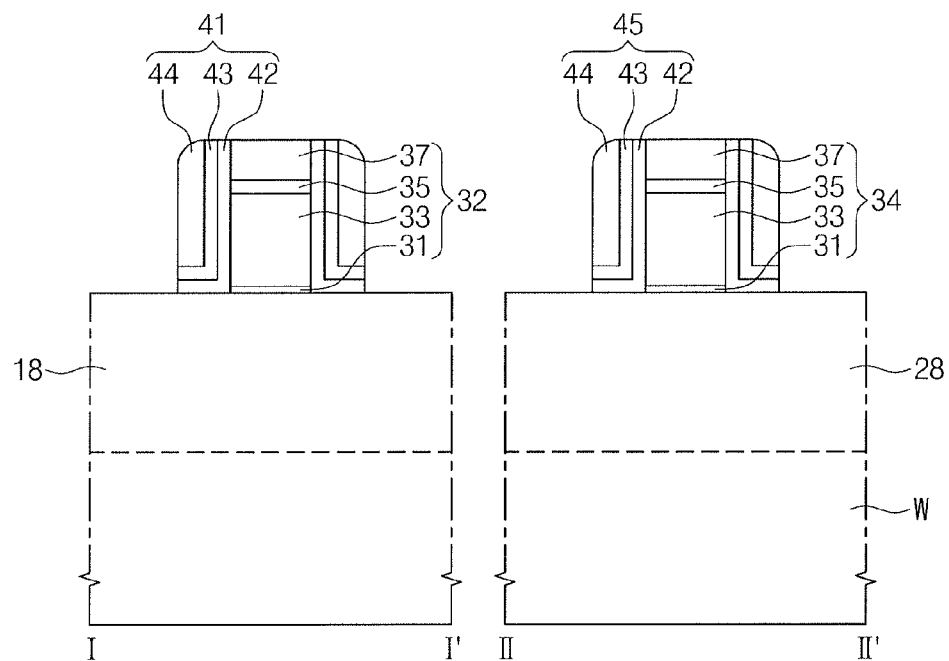

Referring to FIGS. 8 and 9, first and second spacers 41 and 45 may be formed on both, e.g., opposite, sidewalls of the first and second dummy gate stacks 32 and 34 (operation S22). The first and second spacers 41 and 45 may be formed of or include, e.g., silicon oxide, silicon nitride, or silicon oxynitride. Each of the first and second spacers 41 and 45 may include an inner spacer 42, an intermediate spacer 43, and an outer spacer 44.

In detail, referring to FIG. 8, a lower spacer layer 42a and an intermediate spacer layer 43a may be sequentially formed on the first and second dummy gate stacks 32 and 34 and the substrate W. The lower spacer layer 42a and the intermediate spacer layer 43a may be formed using a chemical vapor deposition (CVD) process.

Referring to FIG. 9, the outer spacers 44 may be formed on a sidewall of the intermediate spacer layer 43a. For example, the outer spacer 44 may be formed by depositing an upper spacer layer and etching the upper spacer layer in a self-aligned manner. The upper spacer layer may be formed on the intermediate spacer layer 43a. The outer spacer 44 may be thicker than the lower spacer layer 42a and the intermediate spacer layer 43a. Also, the intermediate spacer 43 and the inner spacer 42 may be formed by etching the intermediate spacer layer 43a and the lower spacer layer 42a. The outer spacer 44 may be used as an etch mask in the process of etching the intermediate spacer layer 43a and the lower spacer layer 42a. As a result, the inner spacer 42, the intermediate spacer 43, and the outer spacer 44 may be formed on both sidewalls of each of the first and second dummy gate stacks 32 and 34.

Figure 10:
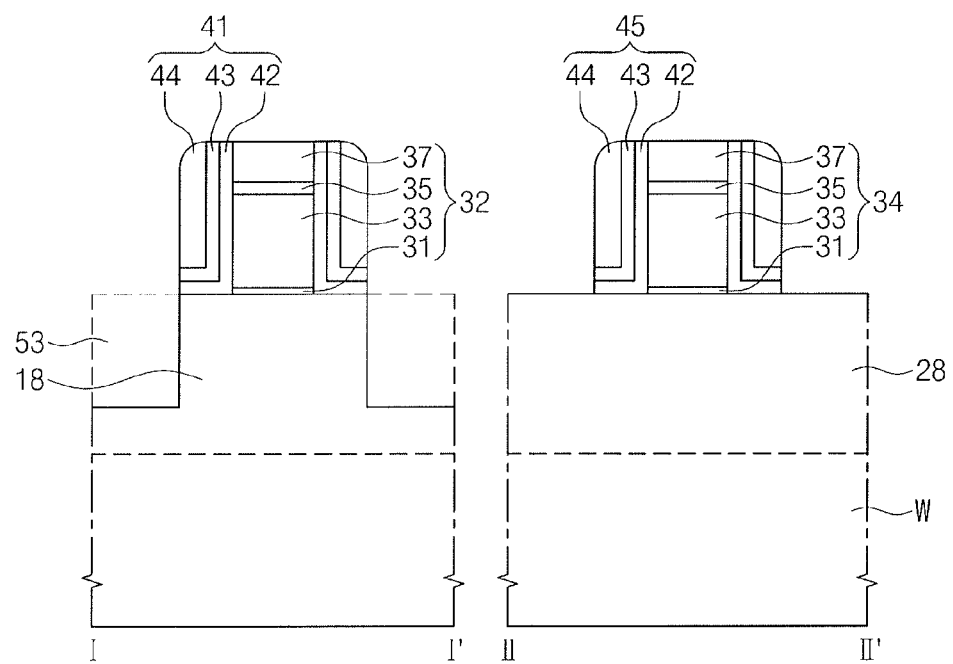
Figure 11:
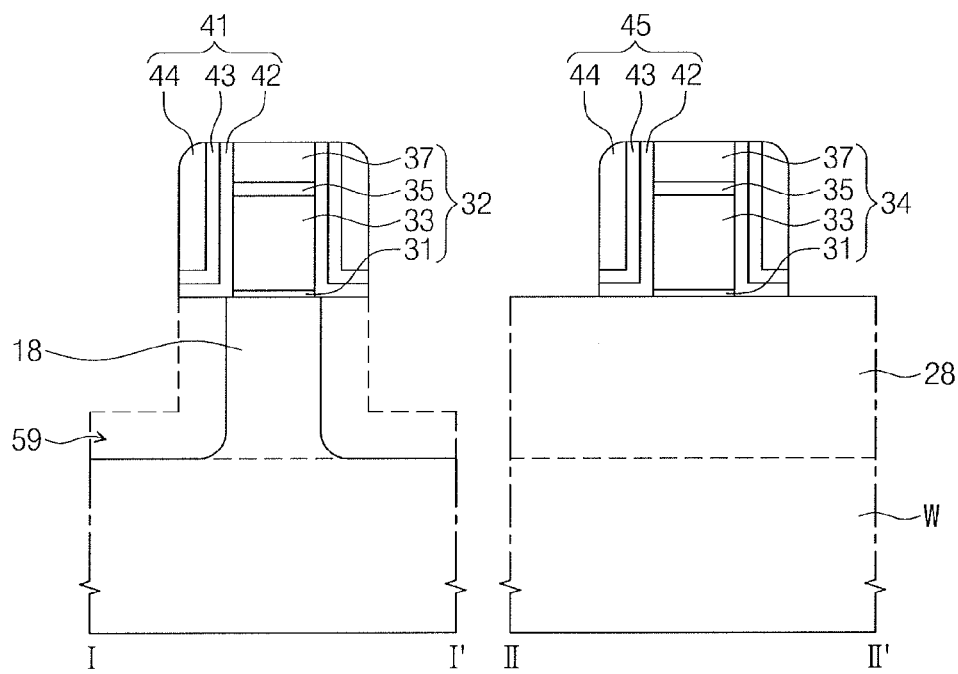

Referring to FIGS. 10 and 11, the first fin pattern 18 may be partially removed to form fin recesses 59 on the device region 10 (operation S23). For example, the fin recesses 59 may be formed from preliminary fin recesses 53. During the formation of the fin recesses 59, the second fin pattern 28 may be protected by a resist pattern. Alternatively, the second fin pattern 28 may be partially removed to form fin recesses.

In detail, referring to FIG. 10, the preliminary fin recesses 53 may be formed outside the first dummy gate stack 32 and the first spacers 41. The preliminary fin recesses 53 may be formed by an anisotropic etching method. The preliminary fin recesses 53 may be aligned with the first spacers 41, when viewed in a plan view.

Referring to FIG. 11, the fin recesses 59 may be formed by isotropically etching the first fin pattern 18. For example, the first fin pattern 18 may be etched by a wet-etching method. The fin recesses 59 may include portions positioned under the first spacers 41.

Figure 12:
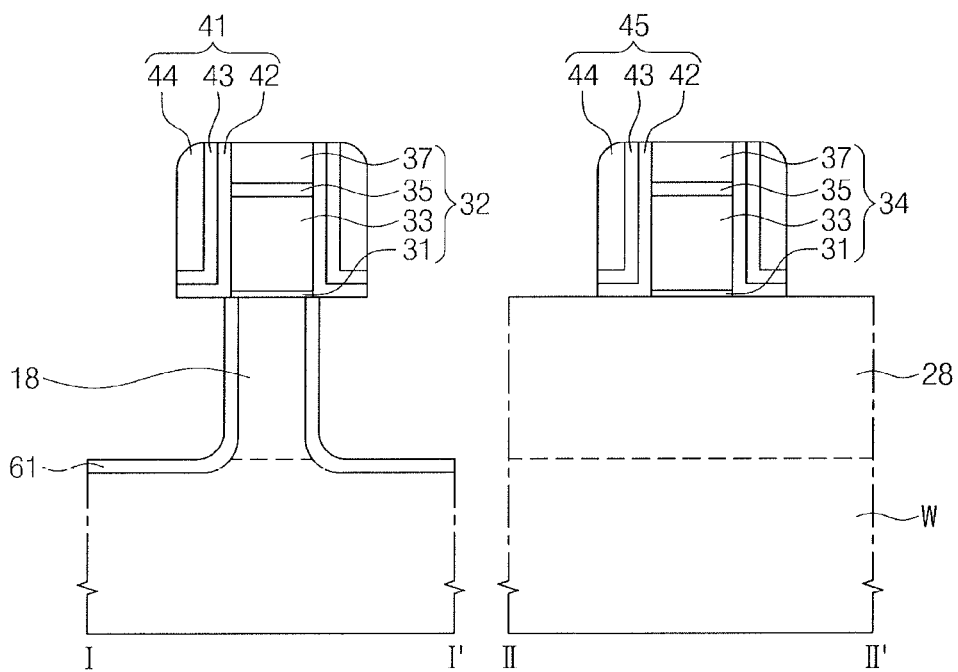

Referring to FIG. 12, LDDs 61 may be formed in bottom and side portions of the fin recesses 59 (operation S24). The LDDs 61 may be formed by an ion implantation process. The LDDs 61 may be formed to contain impurities, whose conductivity type is different from that of impurities in the first fin pattern 18. The LDDs 61 may have a uniform thickness along inner surfaces of the fin recesses 59. In some embodiments, the first fin pattern 18 may contain boron (B), and the LDDs 61 may contain arsenic (As) or phosphorus (P). In certain embodiments, the first fin pattern 18 may contain arsenic (As) or phosphorus (P), and the LDDs 61 may contain boron (B).

Figure 13:
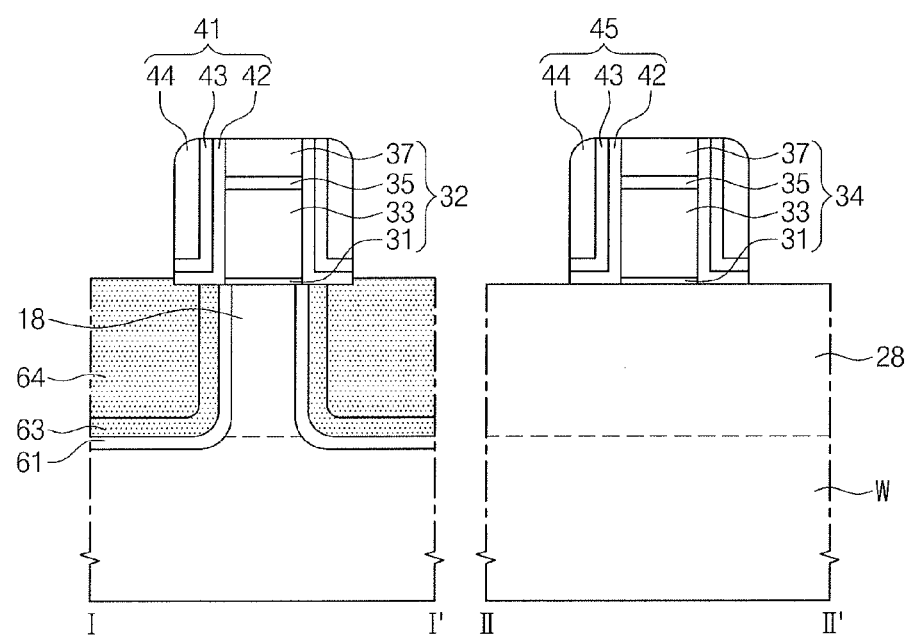
Figure 14:
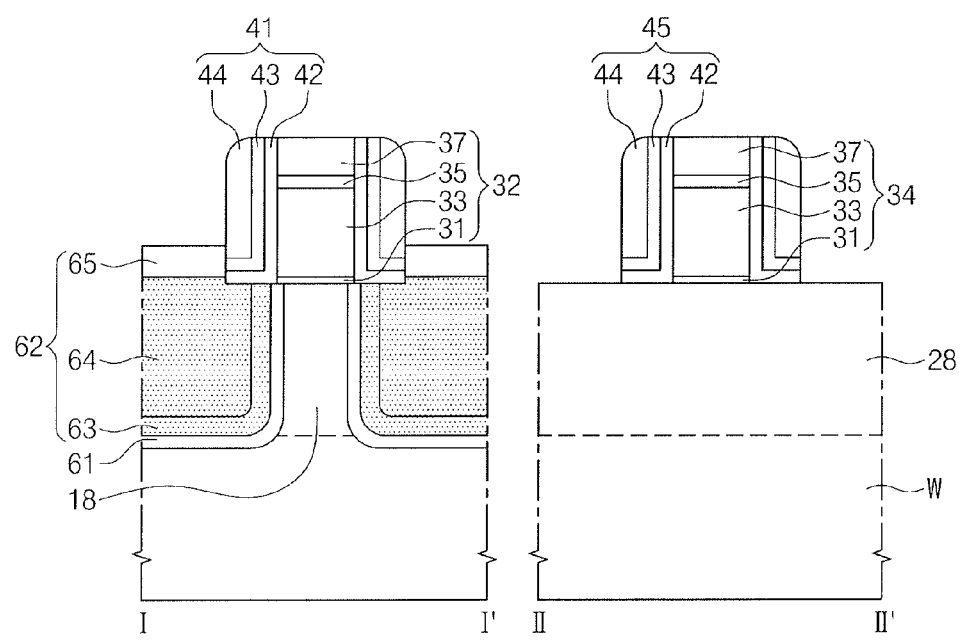

Referring to FIGS. 13 and 14, the stressors 62 may be formed in the fin recesses 59 (operation S25). In some embodiments, the stressors 62 may include an embedded stressor or a strain-inducing pattern. For example, the stressors 62 may include first to third semiconductor layers 63, 64, and 65. During formation of the stressors 62, the second fin pattern 28 may be protected by a mask layer. In certain embodiments, the stressors may be formed in the fin recesses of the second fin pattern 28.

In detail, referring to FIG. 13, the first and second semiconductor layers 63 and 64 may be sequentially formed in the fin recesses 59. Each of the first and second semiconductor layers 63 and 64 may be grown by a selective epitaxial growth (SEG) process and may contain at least one of Si, SiC, or SiGe. The second semiconductor layer 64 may be formed to completely fill the fin recesses 59. A top of the second semiconductor layer 64 may be higher than that of the first fin pattern 18 relative to a bottom of the substrate W.

For example, the first semiconductor layer 63 may include a boron-doped SiGe layer formed by a selective epitaxial growth (SEG) process. In the first semiconductor layer 63, a content of germanium (Ge) may range from about 10% to about 25%. In the first semiconductor layer 63, a content of boron (B) may be higher than in the LDD 61. The first semiconductor layer 63 may be formed to conformally cover inner surfaces of the fin recesses 59. The second semiconductor layer 64 may include a boron-doped SiGe layer formed by a selective epitaxial growth (SEG) process.

In the second semiconductor layer 64, a content of germanium (Ge) may be higher than in the first semiconductor layer 63. For example, in the second semiconductor layer 64, the content of germanium (Ge) may range from about 25% to about 50%. In the second semiconductor layer 64, a content of boron (B) may be higher than in the first semiconductor layer 63. Alternatively, each of the first and second semiconductor layers 63 and 64 may contain SiC. The first and second semiconductor layers 63 and 64 may include a silicon (Si) layer formed by a selective epitaxial growth (SEG) process.

Referring to FIG. 14, the third semiconductor layer 65 may be formed on the second semiconductor layer 64. The third semiconductor layer 65 may include a silicon (Si) layer formed by a selective epitaxial growth (SEG) process.

Figure 15:
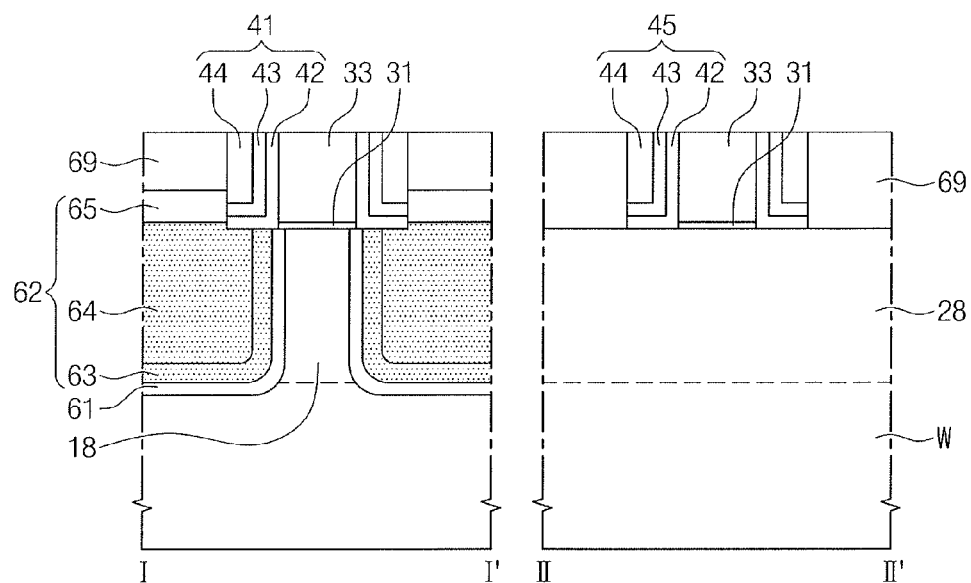

Referring to FIG. 15, an interlayer insulating layer 69 may be formed outside the first and second spacers 41 and 45 and on the substrate W (operation S26). The interlayer insulating layer 69 may include a dielectric layer, which may be formed of at least one of silicon oxide, silicon nitride, or silicon oxynitride. The formation of the interlayer insulating layer 69 may include a thin-film deposition process and a planarization process. A chemical-mechanical polishing (CMP) process, an etch-back process, or any combination thereof may be performed to planarize the interlayer insulating layer 69. The mask pattern 37 and the buffer pattern 35 may be removed during the planarization of the interlayer insulating layer 69. The interlayer insulating layer 69, the first and second spacers 41 and 45, and the dummy gate electrode pattern 33 may have top surfaces that are exposed at the substantially same level.

Figure 16:
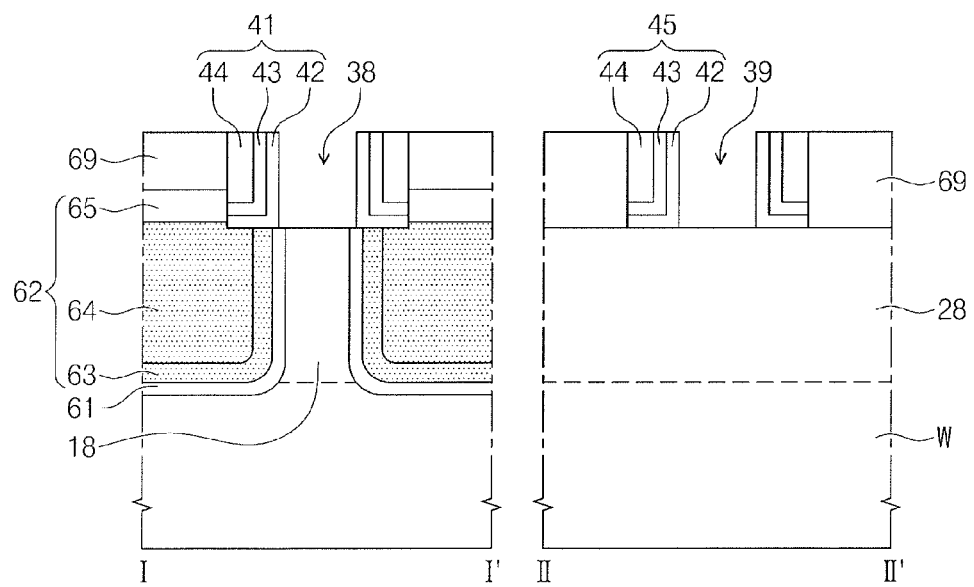

Referring to FIG. 16, the dummy gate dielectric pattern 31 and the dummy gate electrode pattern 33 may be removed to form first and second trenches 38 and 39 (operation S27). The first and second fin patterns 18 and 28 may be exposed through the first and second trenches 38 and 39.

Figure 17:
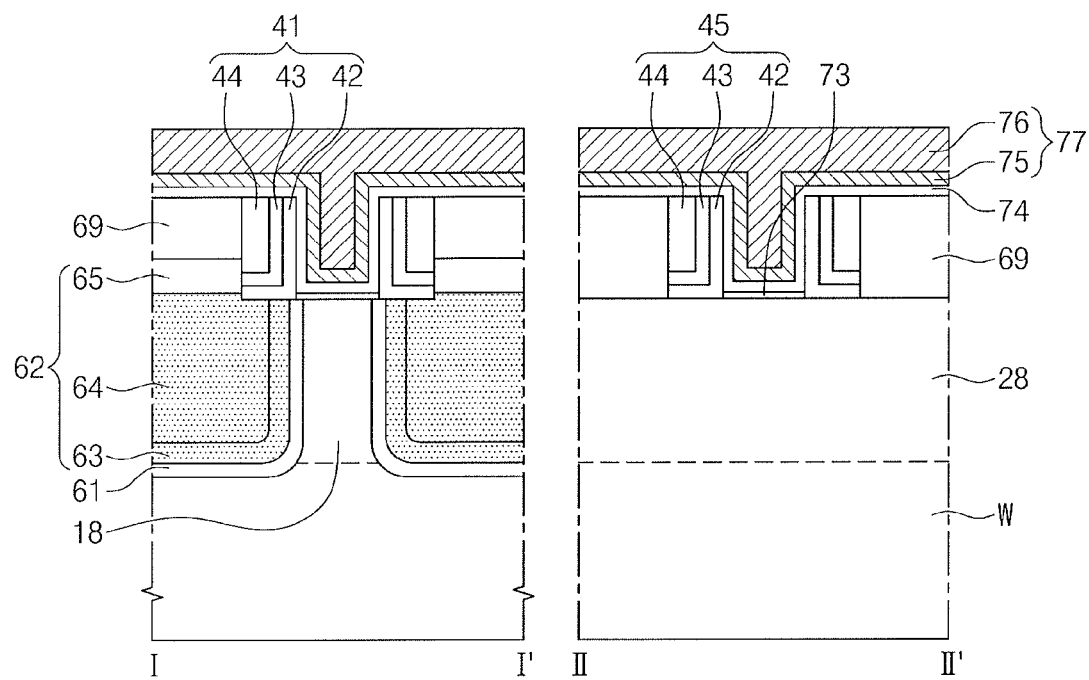

Referring to FIG. 17, first and second gate dielectric layers 73 and 74 and a gate electrode layer 77 may be formed (operation S28). In some embodiments, the first and second gate dielectric layers 73 and 74 may be formed to have a thickness of about 3 nm to about 50 nm.

The first gate dielectric layer 73 may be formed on the first and second fin patterns 18 and 28. The first gate dielectric layer 73 may be referred to as an interfacial oxide layer. The first gate dielectric layer 73 may be formed by performing a cleaning process on the dummy gate dielectric pattern 31. The first gate dielectric layer 73 may be formed of or include silicon oxide. The first gate dielectric layer 73 may be formed on bottom surfaces of the first and second trenches 38 and 39. In certain embodiments, the first gate dielectric layer 73 may serve as the dummy gate dielectric pattern 31. For example, the first gate dielectric layer 73 may have a thickness of about 1 nm.

The second gate dielectric layer 74 may be formed using an atomic layer deposition process. In some embodiments, the second gate dielectric layer 74 may be formed of or include at least one of silicon oxide, silicon nitride, silicon oxynitride, high-k dielectric materials. For example, the second gate dielectric layer 74 may include HfO or HfSiO. The second gate dielectric layer 74 may have a thickness of about 2 nm to about 49 nm. The second gate dielectric layer 74 may be formed on side and bottom surfaces of the first and second trenches 38 and 39. The first gate dielectric layer 73 may be formed between the first and second fin patterns 18 and 28 and the second gate dielectric layer 74.

One of the first and second gate dielectric layers 73 and 74 may be formed on the low-voltage device region 16. Alternatively, a third gate dielectric layer, which is different from the first and second gate dielectric layers 73 and 74, may be formed on the low-voltage device region 16. The third gate dielectric layer may be formed of substantially the same material as that of the first gate dielectric layer 73 or the second gate dielectric layer 74. The third gate dielectric layer may be formed to have a thickness smaller than those of the first and second gate dielectric layers 73 and 74. For example, the thickness of the third gate dielectric layer may range from about 1 nm to about 20 nm.

Referring back to FIG. 17, the gate electrode layer 77 may cover top and side surfaces of the first and second fin patterns 18 and 28. The gate electrode layer 77 may be formed to completely fill the first and second trenches 38 and 39 and to cover the substrate W. In some embodiments, the gate electrode layer 77 may include a work-function layer 75 and a low-resistance layer 76.

The work-function layer 75 may be formed on the second gate dielectric layer 74, e.g., the work-function layer 75 may be on the second gate dielectric layer 74 and conformal along a bottom and sidewalls of the first and second trenches 38 and 39. In some embodiments, the work-function layer 75 may be formed by an atomic layer deposition method. The work-function layer 75 may be formed of or include, e.g., an N- or P-type work-function metal. The N-type work-function metal may include TiC, TiAl, TaAl, HfAl, or combinations thereof, and the P-type work-function metal may include titanium nitride (TiN).

The low-resistance layer 76 may be formed on the work-function layer 75. In some embodiments, the low-resistance layer 76 may be formed using a sputtering process. The low-resistance layer 76 may include a metal layer, which is formed of or includes, e.g., at least one of W, WN, Ti, TiN, TiAl, TiAlC, Ta, TaN, or conductive carbon.

Figure 18:
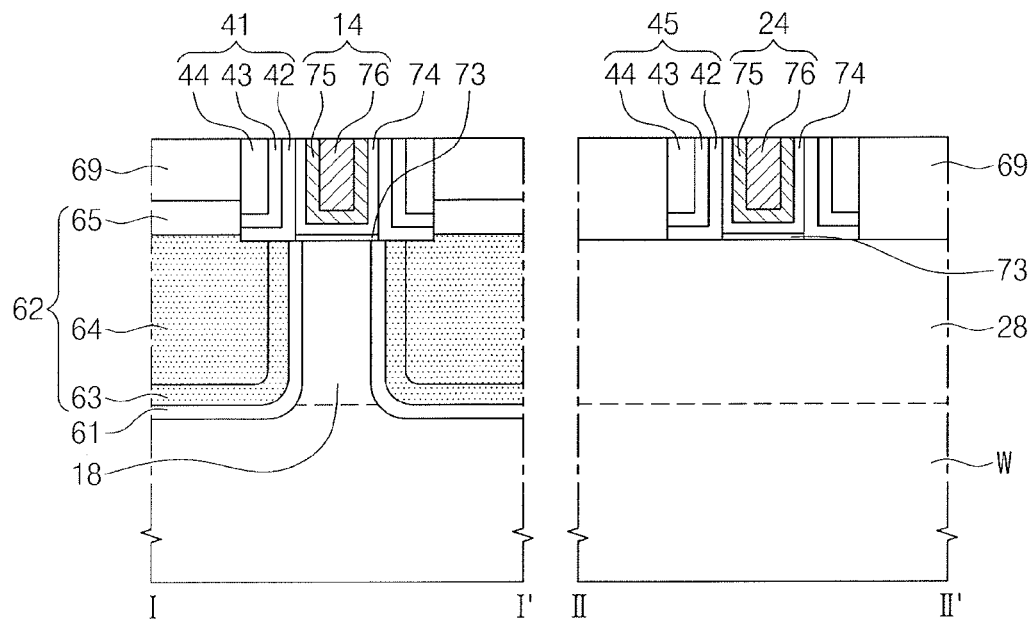

Referring to FIG. 18, the first and second gate dielectric layers 73 and 74 and the gate electrode layers 77 may be planarized to form first and second gate electrodes 14 and 24 (operation S29). The planarization of the gate electrode layer 77 may be performed using at least one of a chemical-mechanical polishing (CMP) process or an etch-back process. Accordingly, the interlayer insulating layer 69, the first and second spacers 41 and 45, the second gate dielectric layer 74, and the gate electrode layers 77 may have top surfaces that are exposed at the substantially same level. The work-function layer 75 may be provided to cover bottom and side surfaces of the low-resistance layer 76. The second gate dielectric layer 74 may be provided to cover bottom and side surfaces of the work-function layer 75.

The first gate electrode 14, the first fin pattern 18, and the stressors 62 may constitute an active fin transistor. In some embodiments, the active fin transistors may be construed as three-dimensional (3D) transistors. In certain embodiments, the second gate electrode 24 and the second fin pattern 28 may be test patterns.

Figure 19:
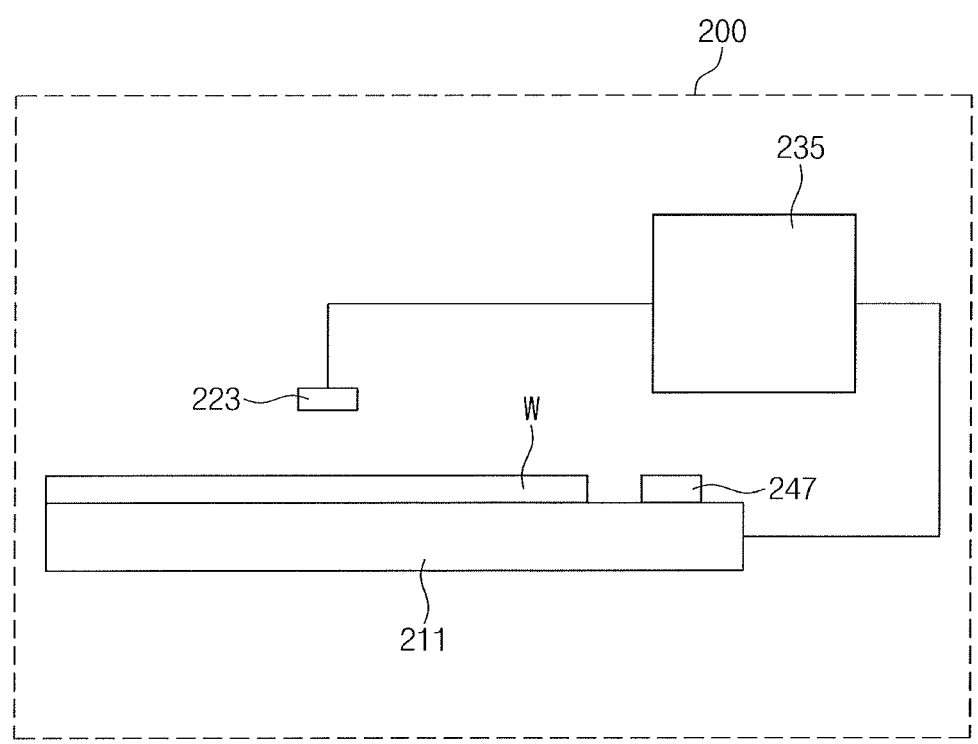
FIG. 19 illustrates a diagram of a measurement device for measuring a contact potential difference of FIG. 1.
Figure 20:
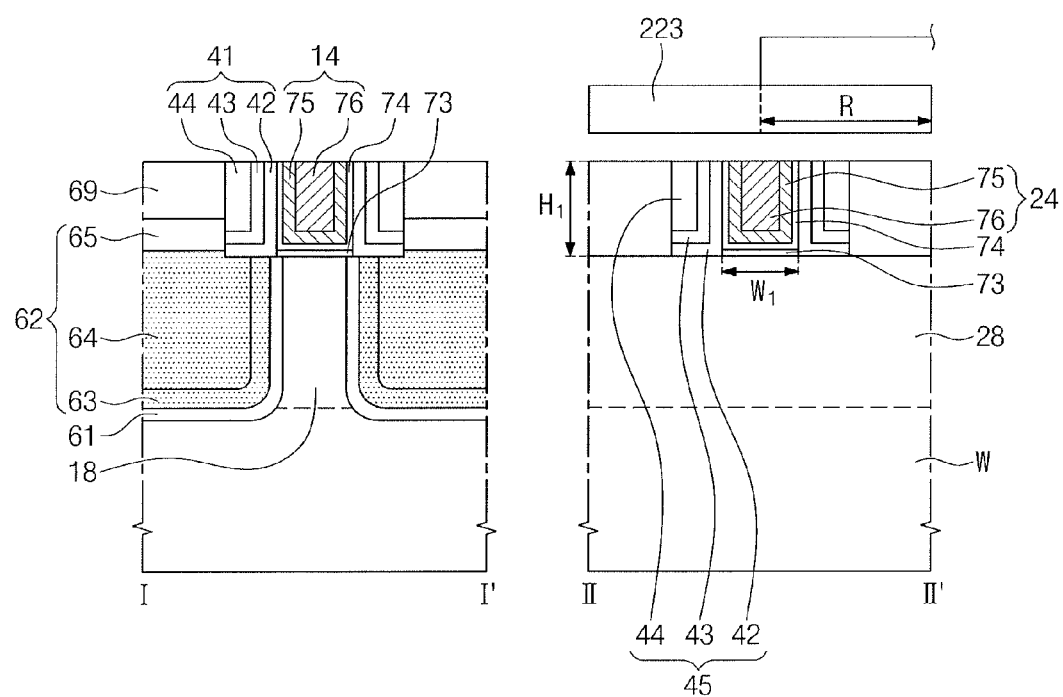
FIG. 20 illustrates a sectional view of a kelvin probe of FIG. 19 and the second gate electrode.

FIG. 19 illustrates a diagram of a measurement device 200 for measuring a contact potential difference (Vcpd) in operation S10 of FIG. 1. FIG. 20 illustrates a sectional view of a kelvin probe 223 in the measurement device 200 above the second gate electrode 24.

Referring to FIGS. 1, 19, and 20, the measurement device 200 may be configured to measure a contact potential difference (Vcpd) of the second gate electrode 24 and to determine a threshold voltage (Vth) of the first gate electrode 14 (operation S30).

Referring to FIG. 19, the measurement device 200 may include a stage 211, a kelvin probe 223, a controller 235, and a reference sample 247. The kelvin probe 223 may be provided on, e.g., above, the stage 211. The kelvin probe 223 may include a non-contact type kelvin probe. For example, a diameter (i.e., 2R) of the kelvin probe 223 may be smaller than 10 μm, e.g., larger than 0.01 μm and smaller than 10 μm. The controller 235 may be, e.g., electrically, connected to the kelvin probe 223 and to the stage 211. The controller 235 may be configured to control positions of the kelvin probe 223 and the stage 211. The reference sample 247 may be provided to be adjacent to a side surface of the stage 211. The reference sample 247 may include a platinum block.

The kelvin probe 223 may be disposed on, e.g., above, the reference sample 247 and then may be disposed on, e.g., above, the substrate W. For example, the Kelvin probe 223 may be aligned above each of the reference sample 247 and the gate electrode 24 on the substrate W in order to measure the contact potential difference (Vcpd) of each of the reference sample 247 and the gate electrode 24, e.g., the Vcpd of each of the reference sample 247 and the gate electrode 24 relative to a tip of the kelvin probe 223.

The controller 235 may receive the measured contact potential difference (Vcpd) from the kelvin probe 223, i.e., the contact potential difference (Vcpd) may correspond to voltages that are measured from the substrate W and the kelvin probe 223. The controller 235 may evaluate an effective work function difference of the gate electrode 24 or the threshold voltage (Vth) of the gate electrode 24, as a difference between the measured contact potential difference (Vcpd) and a measured value of the reference sample 247 is associated with an effective work-function of a device formed on the substrate W or a threshold voltage (Vth) of a gate electrode of the device.

Referring to FIGS. 19 and 20, the kelvin probe 223 may be provided on, e.g., above. the second gate electrode 24. For example, the kelvin probe 223 may be vertically spaced apart from the second gate electrode 24 by a distance of about 1 μm to about 1 cm. In this case, it may be necessary to consider an electric field between the surfaces of the substrate W and the kelvin probe 223.

In some embodiments, an area of the kelvin probe 223, e.g., an area of a surface of the kelvin probe 223 facing the test region 22, may be smaller than that of the test region 22. For example, the test region 22 may have an area of about 78.5 μm$^2$ or larger.

Referring to FIGS. 3, 19, and 20, the kelvin probe 223 may be used to perform a measurement process on a device region, on which gate electrodes are repeatedly arranged, and thereby to measure a contact potential difference (Vcpd). If a distance $D_1$ between adjacent second gate electrodes 24 is increased to be higher than a specific level, the kelvin probe 223 may not measure the contact potential difference (Vcpd) on a region including the second gate electrodes 24, e.g., the kelvin probe 223 may not be able to accurately measure the contact potential difference (Vcpd). Therefore, when the distance $D_1$ exceeds a predetermined value, the lack of accuracy in measuring the contact potential difference (Vcpd) may lead to a difficulty in determining the threshold voltage (Vth) of the gate electrode.

For example, according to embodiments, the distance $D_1$ between adjacent second gate electrodes 24 may be set to be about 4 μm or less. In another example, adjacent second gate electrodes 24 may be formed to have a distance therebetween that is smaller than 1/2.5 times a diameter of the kelvin probe 223, in consideration of the electric field produced between the substrate W and the kelvin probe metal 223 (when the contact potential difference (Vcpd) is measured), and an insulating layer between the gate electrodes. For example, if the distance $D_1$ between the second gate electrodes 24 is larger than about 4 μm, the threshold voltage (Vth), which is obtained from a measurement value of the contact potential difference (Vcpd) using the kelvin probe 223, may not have a sufficiently high accuracy.

The controller 235 may be configured to perform a measurement process for obtaining the contact potential difference (Vcpd) from the second gate electrode 24 or from a gate electrode region via the Kelvin probe 223, and to obtain the threshold voltage (Vth) of a target object (i.e., the gate electrode) based on a measurement value of the reference sample 247 obtained using the same method. For example, the contact potential difference (Vcpd) of the second gate electrode 24 may be proportional to a work function or a thickness of the work-function layer 75. The work function of the work-function layer 75 may be dependent on its material. A thickness of the work-function layer 75 may be calculated from the measured contact potential difference (Vcpd). Thus, the controller 235 may calculate the threshold voltage (Vth) of the first gate electrode 14 according to the calculated thickness of the work-function layer 75 (calculated from the measured contact potential difference (Vcpd) of the second gate electrode 24). The low-resistance layer 76 may not affect the contact potential difference (Vcpd). The work-function and the thickness of the work-function layer 75 may be calculated into the threshold voltage (Vth) of the second gate electrode 24.

The measured contact potential difference (Vcpd) may be associated with or correspond to the measured threshold voltage (Vth) of the second gate electrode 24, e.g., the measured contact potential difference (Vcpd) of the second gate electrode 24 may substantially equal the threshold voltage (Vth) of the second gate electrode 24. A measurement accuracy of the contact potential difference (Vcpd) may be dependent on an effective area of the work-function layer 75. This is because it corresponds to a ratio of a metal layer of a device substantially contributing to the threshold voltage. The measurement accuracy may be given as a ratio of a measured value of the threshold voltage (Vth) to the threshold voltage (Vth) calculated from a structure of the second gate electrode 24. Also, the measurement accuracy may be associated with an intensity of a signal, which is obtained from the measurement on a substrate.

The measurement accuracy of the contact potential difference (Vcpd) may be changed depending on an effective area of the work-function layer 75 of the second gate electrode 24. In some embodiments, the effective area may include a planar area and a vertical area.

The planar area may correspond to a horizontal area of the work-function layer 75. For example, the planar area may be obtained by multiplying a length L1 and a width W1 of the second gate electrode 24 (FIG. 3).

The vertical area may correspond to an area, in a height direction, e.g., along a direction normal to the horizontal area, of the work-function layer 75. In some embodiments, the vertical area may include a vertical sidewall area and a vertical channel area.

The vertical sidewall area may be an area of the work-function layer 75 adjacent to the second spacer 45, in its height direction. The vertical sidewall area may be proportional to a height of the second spacer 45. For example, the vertical sidewall area may be obtained by $2 \times L1 \times H1$, where L1 is the length of the second gate electrode 24 in FIG. 3 and H1 is a height of the second gate electrode 14 in FIG. 20. Accordingly, the effective area of the work-function layer 75 may be proportional to the height of the second gate electrode 24.

The vertical channel area may be associated with an area of the work-function layer 75 adjacent to sidewalls of the second fin pattern 28, in its height direction. The vertical channel area may be proportional to the height of the second fin pattern 28.

Figure 21:
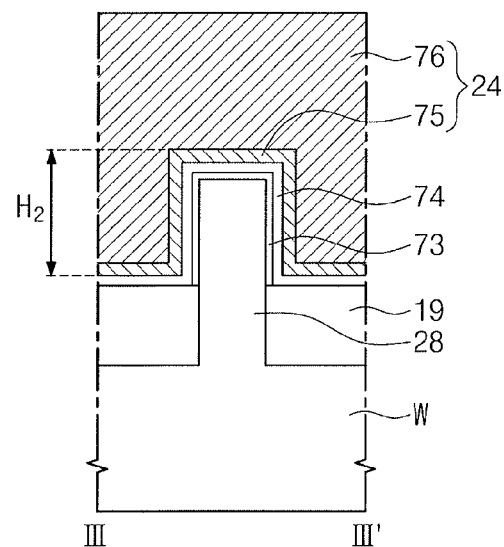
FIG. 21 illustrates a sectional view taken along line III-III' of FIG. 3.

FIG. 21 illustrates a sectional view taken along line III-III' of FIG. 3.

Referring to FIGS. 3 and 21, the vertical channel area may be obtained by multiplying the width $W_1$ of the second gate electrode 24 by a height $H_2$ of the second fin pattern 28. The height $H_2$ of the second fin pattern 28 may correspond to a distance from a top surface of the device isolation layer 19 to a top surface of the second fin pattern 28. Thus, an effective area of the work-function layer 75 may be proportional to the height of the second fin pattern 28.

In the case where 3D and planar transistors have substantially the same line width and length, they may have the same planar area. Since the planar transistor does not have a vertical area, the 3D transistor may have an effective area larger than that of the planar transistor. When the 3D and planar transistors have the same planar area, a measurement accuracy or sensitivity of a contact potential difference of the 3D transistor may be higher than that of a contact potential difference of the planar transistor. In other words, the second fin pattern 28 and the second gate electrode 24 may contribute to increased reliability in measuring the contact potential difference (Vcpd).

Figure 22:
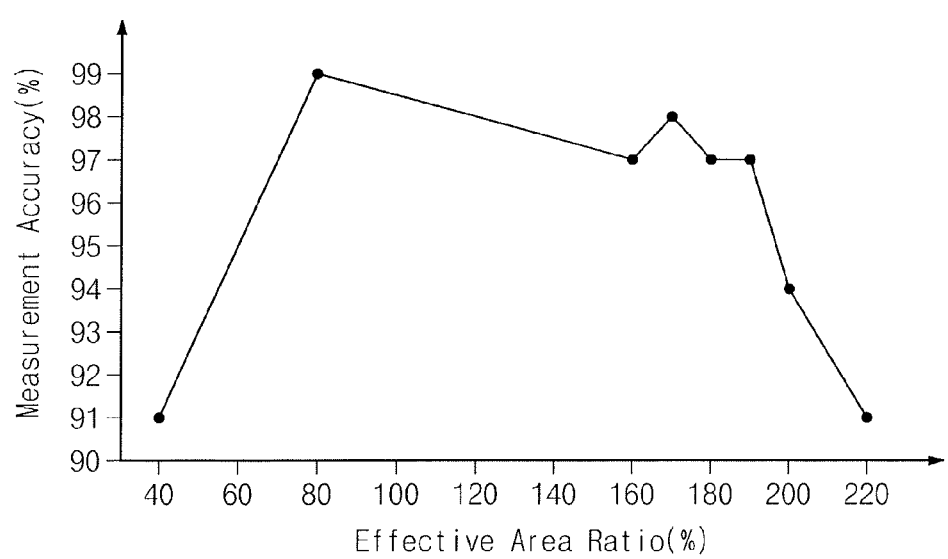
FIG. 22 illustrates a graph showing dependency of measurement accuracy on an effective area ratio of a work-function layer of the second gate electrode.

FIG. 22 illustrates a graph showing dependency of measurement accuracy on an effective area ratio of the work-function layer 75 of the second gate electrode 24. As discussed previously, the measurement accuracy is given as a ratio of a measured value of the threshold voltage (Vth) to the threshold voltage (Vth) calculated from a structure of the second gate electrode 24.

Referring to FIG. 22, when the work-function layer 75 had an effective area ratio of about 85% to about 183%, a threshold voltage (Vth) of a gate electrode, which was obtained from a measurement of a contact potential difference (Vcpd) using the measurement device 200, had a measurement accuracy of 95% or higher. Here, an effective area ratio refers to a ratio of an effective area of the work-function layer 75 of the second gate electrode 24 (calculated as described previously) to a total planar area of the test region 22. For example, when the work-function layer 75 had an effective area ratio of about 85%, the measurement accuracy was 99%. When the work-function layer 75 had an effective area ratio of about 173%, the measurement accuracy was 98%. When the work-function layer 75 had an effective area ratio of about 165%, 178%, or 183%, the measurement accuracy was 97%.

When the work-function layer 75 had an effective area ratio (e.g., about 38%) lower than about 85%, the measurement accuracy of the measurement device 200 was lower than 90%. Even when the work-function layer 75 had an effective area ratio higher than about 183%, if the distance $D_1$ between the gate electrodes was greater than a specific value, the threshold voltage (Vth) measured by the measurement device 200 had a measurement accuracy lower than 95%. For example, when the work-function layer 75 had an effective area of about 194%, the measurement accuracy was 94%. When the work-function layer 75 had an effective area of about 225%, the measurement accuracy was 91%.

After the measurement of the threshold voltage (Vth) of the second gate electrode 24, an upper insulating layer may be formed on the first and second gate electrodes 14 and 24, and the interlayer insulating layer 69. Then, a portion of the upper insulating layer may be removed to form contact holes, each of which exposes a portion of a corresponding one of the first and second gate electrodes 14 and 24. Thereafter, interconnections may be formed in the contact holes and on portions of the upper insulating layer.

According to some embodiments, a method of fabricating a semiconductor device may include forming a gate electrode on a fin pattern and measuring a contact potential difference (Vcpd). The measured contact potential difference may be used to determine a threshold voltage of the gate electrode. In some embodiments, the contact potential difference (Vcpd) may be measured by a kelvin probe. The measurement of the Vcpd of the gate electrodes may be performed before interconnections formed on the gate electrodes. Accordingly, an in-line monitoring technique in which the effective work function of the gate electrode is rapidly measured in a corresponding process is provided, and a time for feedback on the work function difference of the gate electrodes in processes may be reduced.

Further, the gate electrode may include a work-function layer and a low-resistance layer. An effective area of the work-function layer may be proportional to a height of the fin pattern and a distribution density on a pattern. Furthermore, the effective area of the work-function layer may also be proportional to a height of the gate electrode. Considering an electric field between the kelvin probe and a substrate (e.g., an electrode of a pattern and a neighboring insulating layer), the effective area of the work-function layer may be proportional to measurement accuracy of the kelvin probe. This may allow the probe to have a geometrically optimized shape. Accordingly, owing to the fin pattern, which is optimized for the measurement of such electric characteristics, and the gate electrode on the fin pattern, it may be possible to increase an effective area of the work-function layer and, moreover, to improve accuracy in the measurement of the threshold voltage of the gate electrode via the measurement of the contact potential difference (Vcpd).

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of fabricating a semiconductor device, the method comprising:
    forming first and second fin patterns in an active region and in a measurement region of a substrate, respectively, the measurement region being different from the active region;
    forming an insulating layer on the first and second fin patterns;
    forming first and second trenches through the insulating layer, such that the first and second trenches partially expose the first and second fin patterns, respectively;
    forming first and second gate electrodes in the first and second trenches to cross the first and second fin patterns, respectively; and
    measuring a contact potential difference (Vcpd) of the second gate electrode to determine a threshold voltage of the first gate electrode based on the measured contact potential difference (Vcpd),
    wherein each of the second gate electrodes includes a work-function layer, and a low-resistance layer on the work-function layer, the work-function layer having an effective area ratio of about 85% to about 183% with respect to a planar area of the measurement region, and
    wherein the measurement region is formed in a scribe region defining the active region.

2. The method as claimed in claim 1, wherein forming the first and second gate electrodes includes:
    forming the work-function layer in the first and second trenches and on the insulating layer;
    forming the low-resistance layer on the work-function layer to fill the first and second trenches; and
    planarizing the work-function layer and the low-resistance layer to expose the insulating layer,
    wherein the contact potential difference (Vcpd) is measured by a kelvin probe that is provided on the planarized top surface of the work-function layer and the low-resistance layer in the measurement region.

3. The method as claimed in claim 2, wherein the work-function layer of the second gate electrodes is formed to have an effective area ratio of about 165% to about 183% with respect to the planar area of the measurement region.

4. The method as claimed in claim 2, wherein the work-function layer of the second gate electrodes is formed to have an effective area ratio of about 173% with respect to the planar area of the measurement region.

5. The method as claimed in claim 2, wherein forming the first and second gate electrodes further comprises:
    forming first and second dummy gate stacks that are provided in the active region and the measurement region to cross the first and second fin patterns, respectively;
    forming first and second spacers on opposite sidewalls of the first and second dummy gate stacks, respectively;
    removing portions of the first fin patterns adjacent to the first spacers to form fin recesses in the active region;
    forming stressors in the fin recesses;
    forming the insulating layer outside the first and second spacers and on the substrate; and
    removing the first and second dummy gate stacks to form the first and second trenches.

6. The method as claimed in claim 2, wherein the kelvin probe has a diameter of about 0.01 μm, to about 10 μm, and the second gate electrodes are formed to be spaced apart from each other by a distance that is smaller than 1/2.5 times the diameter of the kelvin probe.

7. The method as claimed in claim 1, wherein the second fin patterns are spaced apart from each other by a distance of about 200 nm or less, and a number of the second fin patterns formed in the measurement region is three or more.

8. The method as claimed in claim 1, further comprising a gate dielectric layer formed between the first and second fin patterns and the first and second gate electrodes, such that the gate dielectric layer has a thickness of about 3 nm to about 50 nm.

9. The method as claimed in claim 1, wherein the active region includes a device region, and the measurement region is formed in a scribe region defining the active region and has an area of about 78.5 μm$^2$ or larger.

10. A semiconductor device, comprising:
    a substrate having an active region and a measurement region;
    first and second fin patterns in the active region and the measurement region, respectively, the first and second fin patterns extending in a first direction;
    an insulating layer on the first and second fin patterns, and having first and second trenches, the first and second trenches partially exposing the first and second fin patterns, respectively;
    first and second gate electrodes in the first and second trenches, respectively, the first and second gate electrodes extending in a second direction different from the first direction,
    wherein the measurement region is formed in a scribe region defining the active region, and
    wherein each of the second gate electrodes includes:
        a work-function layer, and a low-resistance layer on the work-function layer, the work-function layer having an effective area ratio of about 85% to about 183% with respect to a planar area of the measurement region.

11. The semiconductor device as claimed in claim 10, wherein the work-function layer has an effective area ratio of about 165% to about 183% with respect to the planar area of the measurement region.

12. The semiconductor device as claimed in claim 10, wherein the work-function layer has an effective area ratio of about 173% with respect to the planar area of the measurement region.

13. The semiconductor device as claimed in claim 10, further comprising first and second gate dielectric layers between respective first and second fin patterns and corresponding first and second gate electrodes, each of the first and second gate dielectric layers having a thickness of about 3 nm to about 50 nm.

14. The semiconductor device as claimed in claim 13, wherein the active region includes:

a high-voltage device region having the first and second gate dielectric layers; and a low-voltage device region adjacent to the high-voltage device region, the low-voltage device region having one of the first and second gate dielectric layers.

15. The semiconductor device as claimed in claim 13, wherein the second fin patterns are spaced apart from each other by a distance of about 200 nm or less, and a number of the second fin patterns in the measurement region is three or more.

16. The semiconductor device as claimed in claim 13, further comprising stressors between the first fin patterns, the second fin patterns in the measurement region extending in the first direction, without the stressors.

17. The semiconductor device as claimed in claim 13, wherein the active region includes a device region, and the measurement region is in a scribe line region defining the device region.

18. The semiconductor device as claimed in claim 13, wherein the measurement region has an area of about 78.5 $\mu m^2$ or larger.

19. The semiconductor device as claimed in claim 13, wherein adjacent second gate electrodes are spaced apart from each other by a distance of about 4 µm or less in the first direction.

* * * * *